(12) United States Patent
Tsai et al.

(10) Patent No.: US 11,012,040 B2
(45) Date of Patent: May 18, 2021

(54) RADIO FREQUENCY AMPLIFIER HAVING ADAPTIVE POWER SUPPLY CAPABILITY

(71) Applicant: REALTEK SEMICONDUCTOR CORPORATION, Hsinchu (TW)

(72) Inventors: Yang-Tang Tsai, New Taipei (TW); Po-Chih Wang, Hsinchu County (TW); Ka-Un Chan, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/781,048

(22) Filed: Feb. 4, 2020

(65) Prior Publication Data
US 2020/0259470 A1    Aug. 13, 2020

(30) Foreign Application Priority Data
Feb. 12, 2019 (TW) .................................. 108104598

(51) Int. Cl.
*H03F 1/30* (2006.01)
*H03F 3/189* (2006.01)
(Continued)

(52) U.S. Cl.
CPC ............. *H03F 3/189* (2013.01); *H03F 3/005* (2013.01); *H03F 3/217* (2013.01)

(58) Field of Classification Search
CPC ..................................... H03F 1/30; H03F 3/20
(Continued)

(56) References Cited

U.S. PATENT DOCUMENTS 7,295,075 B2 * 11/2007 Loraine ................. H03F 1/0205
                                                               330/285
7,760,026 B2 *  7/2010 Young ..................... H02M 3/07
                                                               330/297

(Continued)

OTHER PUBLICATIONS

OA letter of the counterpart TW application (appl. No. 108104598) dated Apr. 18, 2019. Summary of the OA letter: Claims 1-4 and 8-10 are rejected as being unpatentable over the cited reference 1 (US_20120176195_A1); and claim 7 is rejected as being unpatentable over the cited reference 1 in view of the cited reference 2 (US_20140184335_A1).

*Primary Examiner* — Henry Choe
(74) *Attorney, Agent, or Firm* — WPAT, PC

(57) ABSTRACT

Disclosed is an apparatus including a radio frequency amplifying circuit, a power supply circuit, and a bias generating circuit. The power supply circuit includes: a first power supply terminal coupled to a first ground terminal via a first capacitor and coupled to/decoupled from the radio frequency amplifying circuit through a first switch; and a second power supply terminal coupled to a second ground terminal via a second capacitor and coupled to/decoupled from the radio frequency amplifying circuit through a second switch, wherein the first capacitor and second capacitor are coupled to/decoupled from the radio frequency amplifying circuit through the first switch and second switch respectively, the supply voltages outputted from the two power supply terminals are different, and the two switches are not concurrently turned on. The radio frequency amplifying circuit operates according to a bias voltage provided by the bias generating circuit and one of the two supply voltages.

10 Claims, 6 Drawing Sheets

(51) Int. Cl.
*H03F 3/217* (2006.01)
*H03F 3/00* (2006.01)

(58) Field of Classification Search
USPC .................................. 330/297, 296, 285, 51
See application file for complete search history.

(56) References Cited

U.S. PATENT DOCUMENTS

| | | | |
|---|---|---|---|
| 8,514,025 B2 * | 8/2013 | Lesso | H03F 1/0216 330/297 |
| 2012/0176195 A1 | 7/2012 | Dawson et al. | |
| 2014/0184335 A1 | 7/2014 | Nobbe et al. | |

* cited by examiner

RADIO FREQUENCY AMPLIFIER HAVING ADAPTIVE POWER SUPPLY CAPABILITY

BACKGROUND OF THE INVENTION

1. Field of the Invention

The present invention relates to a radio frequency amplifier, especially to a radio frequency amplifier having adaptive power supply capability.

2. Description of Related Art

FIG. 1 shows a conventional radio frequency (RF) amplifier. The RF amplifier 100 of FIG. 1 includes a power supply terminal 110, an amplifying circuit 120, and a biasing circuit 130. The power supply terminal 110 could be coupled to a ground terminal (not shown in FIG. 1) via a capacitor (not shown in FIG. 1); and the amplifying circuit 120 and the biasing circuit 130 could be coupled to the above-mentioned ground terminal or other ground terminals. In normal circumstances, the peak value of the output signal of the amplifying circuit 120 does not exceed the double of the supply voltage of the power supply terminal 110 in order to prevent the nonlinearity of the output signal; accordingly, in consideration of the variation of the output signal, the supply voltage of the power supply terminal 110 is usually higher than it would be, and this leads to power dissipation.

In order to reduce power dissipation, a current technique adjusts the electric current of the amplifying circuit 120 by an adjustment on the number of enabled amplifying units of the amplifying circuit 120 or on the bias voltage of the biasing circuit 130. However, this does not reduce the power dissipation caused by the higher supply voltage of the power supply terminal 110.

SUMMARY OF THE INVENTION

An object of the present disclosure is to disclose an apparatus having adaptive power supply capability.

An embodiment of the apparatus of the present disclosure includes a radio frequency (RF) amplifying circuit, a power supply circuit, and a bias generating circuit. The power supply circuit includes a first power supply terminal, a first capacitor, a first switch, a second power supply terminal, a second capacitor, and a second switch. The first power supply terminal is electrically coupled to a first ground terminal via the first capacitor, and electrically coupled to or decoupled from the RF amplifying circuit through the first switch, wherein the first capacitor is also electrically coupled to or decoupled from the RF amplifying circuit through the first switch. The second power supply terminal is electrically coupled to a second ground terminal via the second capacitor, and electrically coupled to or decoupled from the RF amplifying circuit through the second switch, wherein the second capacitor is also electrically coupled to or decoupled from the RF amplifying circuit through the second switch. Additionally, the first power supply terminal outputs a first supply voltage that is different from a second supply voltage to be outputted from the second power supply terminal, and the first switch and the second switch are not concurrently turned on. The radio frequency amplifying circuit is electrically coupled to a third ground terminal and is configured to operate according to a bias voltage and one of the first supply voltage and the second supply voltage. The bias generating circuit is electrically coupled to a fourth ground terminal and configured to provide the bias voltage.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this technical field. If any term is defined in the following description, such term should be interpreted accordingly.

The present disclosure discloses a radio frequency (RF) amplifier having adaptive power supply capability. The RF amplifier can supply power adaptively so as to reduce power dissipation. The RF amplifier is useful to a low power circuit; for instance, a wireless circuit (e.g., a Bluetooth circuit or a Wi-Fi circuit) of an IOT (internet of things) device can incorporate the RF amplifier to reduce power dissipation.

Figure 1:
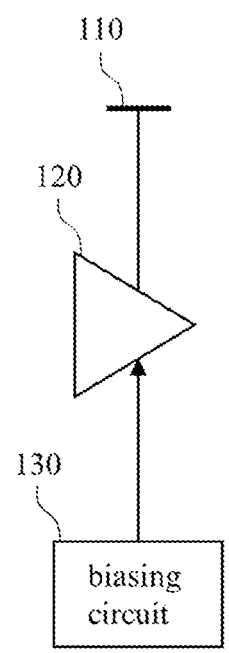
FIG. 1 shows a conventional radio frequency amplifier.
Figure 2:
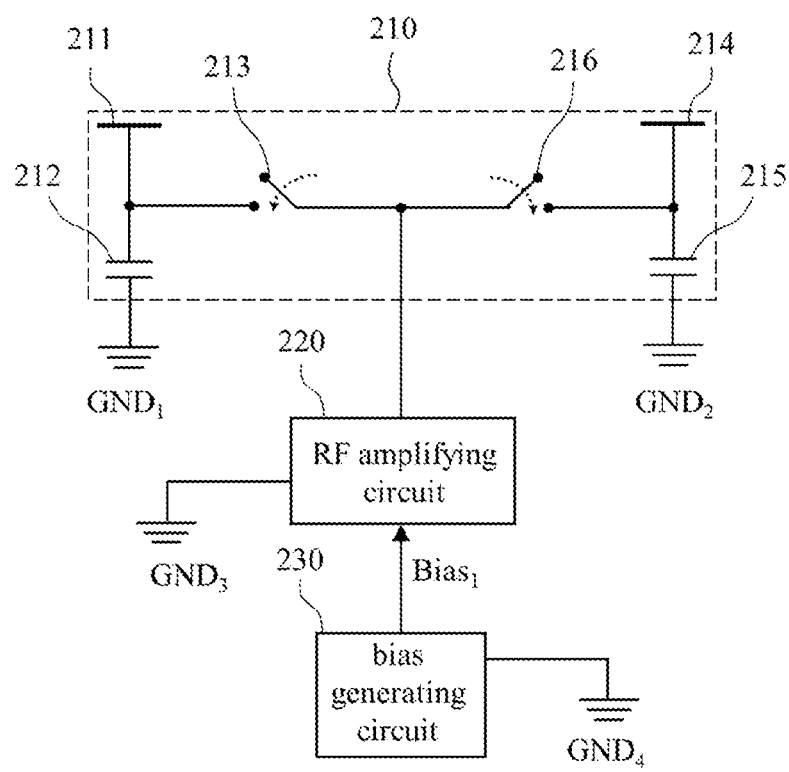
FIG. 2 shows an embodiment of the radio frequency amplifier of the present disclosure having adaptive power supply capability.

FIG. 2 shows an embodiment of the RF amplifier of the present disclosure. The RF amplifier 200 of FIG. 2 includes a power supply circuit 210, an RF amplifying circuit 220, and a bias generating circuit 230, wherein the bias generating circuit 230 could be a known circuit (e.g., the biasing circuit 130 of FIG. 1) or a self-developed circuit.

Please refer to FIG. 2. The power supply circuit 210 includes a first power supply terminal 211, a first capacitor 212, a first switch 213, a second power supply terminal 214, a second capacitor 215, and a second switch 216. The first power supply terminal 211 is used for outputting a first supply voltage, electrically coupled to a first ground terminal $GND_1$ via the first capacitor 212, and electrically coupled to or decoupled from the RF amplifying circuit 220 through the first switch 213, wherein the first capacitor 212 is also electrically coupled to or decoupled from the RF amplifying circuit 220 through the first switch 213 and is used for stabilizing the first supply voltage of the first power supply terminal 211 and used as a filter. The second power supply terminal 214 is used for outputting a second supply voltage, electrically coupled to a second ground terminal $GND_2$ via the second capacitor 215, and electrically coupled to or decoupled from the RF amplifying circuit 220 through the second switch 216, wherein the second capacitor 215 is also electrically coupled to or decoupled from the RF amplifying circuit 220 through the second switch 216 and is used for stabilizing the second supply voltage of the second power supply terminal 214 and used as a filter. The first supply voltage of the first power supply terminal 211 is different from the second supply voltage of the second power supply terminal 214 so that the RF amplifier 200 can choose a supply voltage adaptively. In the embodiment of FIG. 2, the first supply voltage is lower than the second supply voltage; however, this is not a restriction on the scope of the present invention. It should be noted that after reading the present disclosure, people of ordinary skill in the art will appreciate that the power supply circuit 210 can optionally include other power supply terminals, capacitors, and switches that are connected in a way similar to that of FIG. 2 so as to provide more options of supply voltages.

Please refer to FIG. 2. In the embodiment of FIG. 2, the first switch 213 and the second switch 216 are not turned on concurrently; in other words, the switch 213 and the switch 216 are turned off concurrently, or one of them is turned on while the other one is turned off. For instance, the first switch 213 and the second switch 216 are configured to operate according to one or more control signals (e.g., the control signals Ctrl_1 and Ctrl_2 of the control circuit 610 in FIG. 6); when the output of the RF amplifier 200 (e.g., the root mean square (RMS) value, the peak value, or the output value of a lookup table circuit) should be above a threshold or is already above the threshold, the first switch 213 is turned off and the second switch 216 is turned on so that the power supply circuit 210 can provide the higher second supply voltage of the second power supply terminal 214 to meet the requirement for the output; and when the output of the RF amplifier 200 should be or is already below the threshold, the first switch 213 is turned on and the second switch 216 is turned off so that the power supply circuit 210 can provide the lower first supply voltage of the first power supply terminal 211 to reduce power dissipation.

Please refer to FIG. 2. The RF amplifying circuit 220 is electrically coupled to a third ground terminal $GND_3$ and configured to operate according to a bias voltage $Bias_1$ and one of the first supply voltage and the second supply voltage. The bias generating circuit 230 is electrically coupled to a fourth ground terminal $GND_4$ and configured to provide the bias voltage $Bias_1$ for the RF amplifying circuit 220. In an exemplary implementation, at least two of the first ground terminal $GND_1$, the second ground terminal $GND_2$, the third ground terminal $GND_3$, and the fourth ground terminal $GND_4$ are one and the same. In an exemplary implementation, the voltage of the first ground terminal $GND_1$, the voltage of the second ground terminal $GND_2$, the voltage of the third ground terminal $GND_3$, and the voltage of the fourth ground terminal $GND_4$ are the same.

Figure 3:
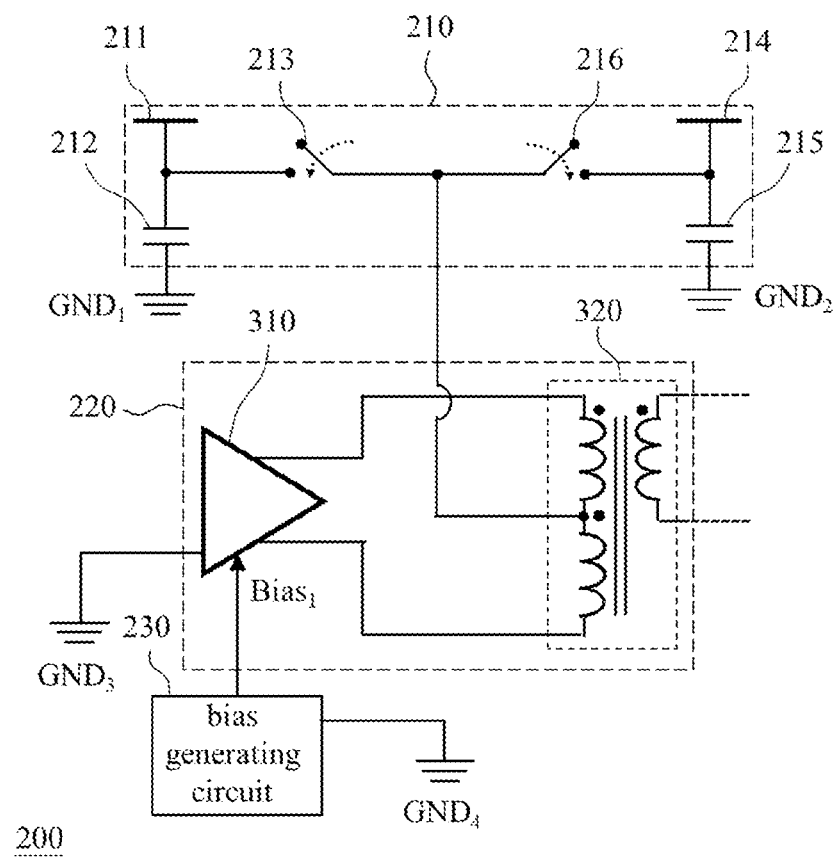
FIG. 3 shows an embodiment of the radio frequency amplifying circuit of FIG. 2.

FIG. 3 shows an embodiment of the RF amplifying circuit 220 of FIG. 2. The RF amplifying circuit 220 of FIG. 3 includes an amplifying circuit 310 and an inductance circuit 320. The amplifying circuit 310 is electrically coupled to the third ground terminal $GND_3$ and configured to receive the bias voltage $Bias_1$ for operation; in addition, the amplifying circuit 310 outputs a differential signal to the inductance circuit 320 according to an input signal (not shown in the figures). The inductance circuit 320 includes a primary side, a secondary side, and a central tap. When one of the first switch 213 and the second switch 216 is turned on, the central tap receives one of the first supply voltage and the second supply voltage, and the primary side receives the differential signal so that the secondary side outputs a differential output. In an exemplary implementation, the amplifying circuit 310 is a known circuit (e.g., the amplifying circuit 120 of FIG. 1) or a self-developed circuit.

Figure 4:
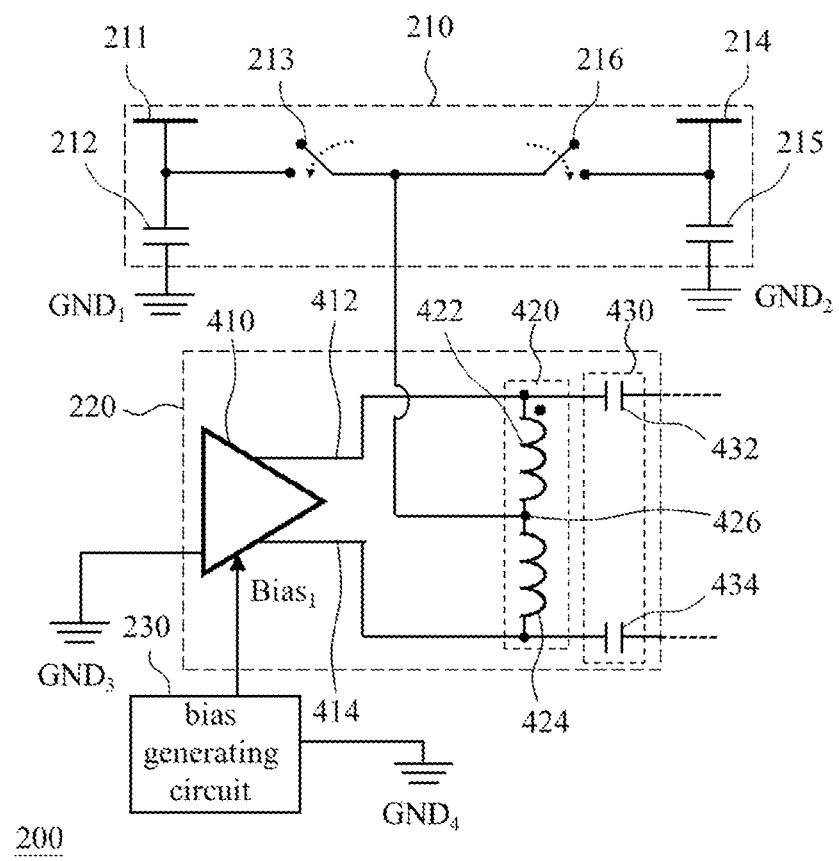
FIG. 4 shows another embodiment of the radio frequency amplifying circuit of FIG. 2.

FIG. 4 shows another embodiment of the RF amplifying circuit 220. The RF amplifying circuit 220 of FIG. 4 includes an amplifying circuit 410, an inductance circuit 420, and a capacitance circuit 430. The amplifying circuit 410 is electrically coupled to the third ground terminal $GND_3$, and configured to operate according to the bias voltage $Bias_1$; in addition, the amplifying circuit 410 is configured to output a differential signal via a first output terminal 412 and a second output terminal 414 according to an input signal (not shown in the figures). The inductance circuit 420 includes a first inductor 422 and a second inductor 424. The first inductor 422 is electrically coupled between the first output terminal 412 and a node 426; the second inductor 424 is electrically coupled between the second output terminal 414 and the node 426; the node 426 is between the first inductor 422 and the second inductor 424, and configured to receive one of the first supply voltage and the second supply voltage. The capacitance circuit 430 includes a first capacitor 432 and a second capacitor 434. The first capacitor 432 is electrically coupled to the first output terminal 412; one end of the first inductor 422 is electrically coupled between the first output terminal 412 and the first capacitor 432; the second capacitor 434 is electrically coupled to the second output terminal 414; one end of the second inductor 424 is electrically coupled between the second output terminal 414 and the second capacitor 434; and the first capacitor 432 and the second capacitor 434 are configured to receive the differential signal and output a differential output.

Figure 5:
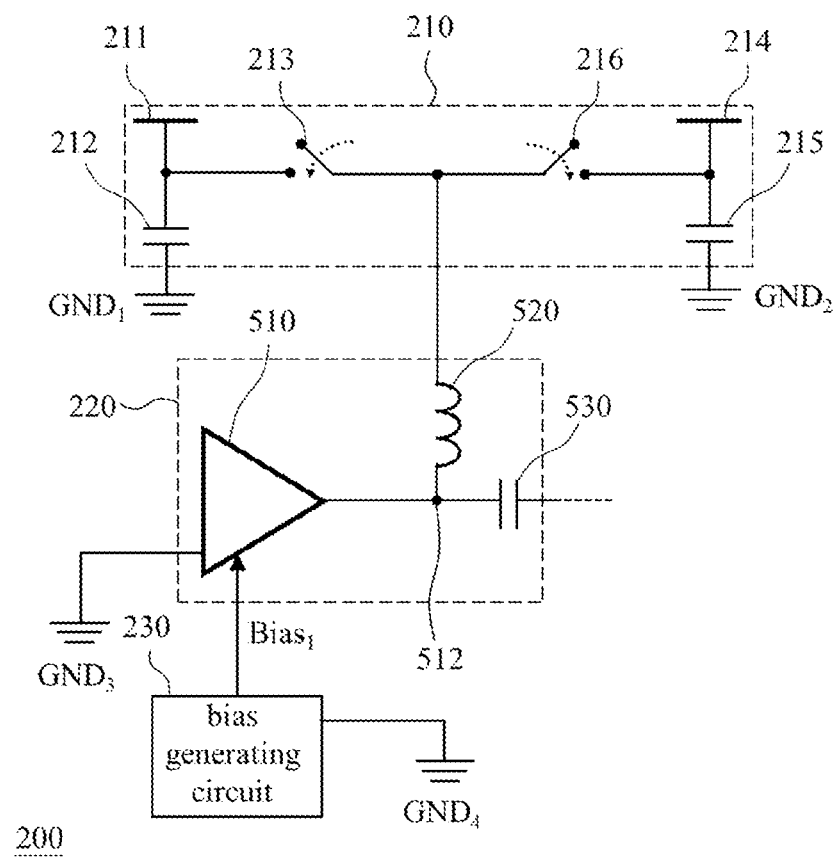
FIG. 5 shows yet another embodiment of the radio frequency amplifying circuit of FIG. 2.

FIG. 5 shows another embodiment of the amplifying circuit 220. The amplifying circuit 220 of FIG. 5 includes an amplifying circuit 510, an inductor 520, and a capacitor 530. The amplifying circuit 510 is electrically coupled to the third ground terminal $GND_3$ and configured to receive the bias voltage $Bias_1$ for operation; in addition, the amplifying circuit 510 is configured to output a single-ended signal via an output node 512 according to an input signal (not shown in the figures). The inductor 520 is electrically coupled between the power supply circuit 210 and the output node 512. The capacitor 530 is electrically coupled to the output node 512 and configured to output a single-ended output according to the single-ended signal.

Figure 6:
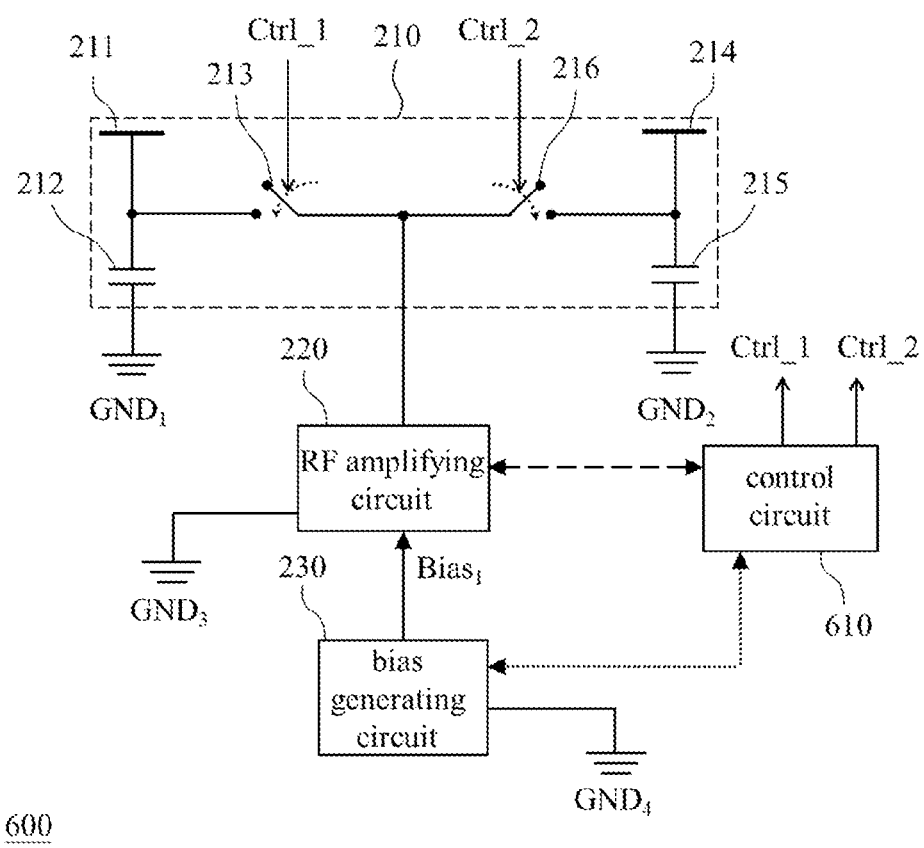
FIG. 6 shows another embodiment of the radio frequency amplifier of the present disclosure having adaptive power supply capability.

FIG. 6 shows another embodiment of the RF amplifier of the present disclosure. Compared with the RF amplifier 200 of FIG. 2, the RF amplifier 600 of FIG. 6 further includes a control circuit 610. The control circuit 610 generates a first control signal Ctrl_1 controlling the first switch 213 and a second control signal Ctrl_2 controlling the second switch 216 in accordance with the requirement for the output of the RF amplifying circuit 220. In an exemplary implementation, when the requirement for the output of the RF amplifying circuit 220 (e.g., the value of a to-be-outputted signal/an outputted signal) is lower than a threshold, the control circuit 610 turns on the first switch 213 with the first control signal Ctrl_1 and turns off the second switch 216 with the second control signal Ctrl_2 so as to let the power supply circuit 210 provide the lower first supply voltage to reduce the power dissipation; and when the requirement for the output of the RF amplifying circuit 220 is higher than the threshold, the control circuit 610 turns on the second switch 216 with the second control signal Ctrl_2 and turns off the first switch 213 with the first control signal Ctrl_1 so as to let the power supply circuit 210 provide the higher second supply voltage to meet the requirement. In an exemplary implementation, the RF amplifying circuit 220 includes a plurality of amplifying units (not shown in the figures) that are connected in series or parallel, and the control circuit 610 can optionally enable/disable at least a part of these amplifying units through a control signal (the dashed arrow line of FIG. 6) according to the requirement for the output of the RF amplifying circuit 220 so as to optimize the utilization of power. In an exemplary implementation, the bias voltage $Bias_1$ of the bias generating circuit 230 is adjustable, and the control circuit 610 can optionally adjust the bias voltage Bias1 of the bias generating circuit 230 through a control signal (the dotted arrow line of FIG. 6) according to the requirement for the output of the RF amplifying circuit. It should be noted that the utilization of the aforementioned controllable amplifying units and adjustable bias voltage Bias1 can be realized by those of ordinary skill in the art referring to the present disclosure and known techniques, and the present invention can achieve a better performance through such utilization.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the RF amplifier of the present invention can select a supply voltage adaptively to reduce the power dissipation.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An apparatus comprising:
   a radio frequency amplifying circuit;
   a power supply circuit including:
     a first capacitor;
     a first switch;
     a second capacitor;
     a second switch;
     a first power supply terminal electrically coupled to a first ground terminal via the first capacitor and electrically coupled to or decoupled from the radio frequency amplifying circuit through the first switch, wherein the first capacitor is electrically coupled to or decoupled from the radio frequency amplifying circuit through the first switch; and
     a second power supply terminal electrically coupled to a second ground terminal via the second capacitor and electrically coupled to or decoupled from the radio frequency amplifying circuit through the second switch, wherein the second capacitor is electrically coupled to or decoupled from the radio frequency amplifying circuit through the second switch; and
   a bias generating circuit electrically coupled to a fourth ground terminal and configured to provide a bias voltage,
   wherein the first power supply terminal outputs a first supply voltage that is different from a second supply voltage to be outputted from the second power supply terminal,
   wherein the first switch and the second switch are not concurrently turned on,
   wherein the radio frequency amplifying circuit is electrically coupled to a third ground terminal and is configured to operate according to the bias voltage and one of the first supply voltage and the second supply voltage.

2. The apparatus of claim 1, wherein when the first switch is turned on, the second switch is turned off, and when the second switch is turned on, the first switch is turned off.

3. The apparatus of claim 1, wherein at least two of the first ground terminal, the second ground terminal, the third ground terminal, and the fourth ground terminal are one and the same.

4. The apparatus of claim 1, wherein a voltage of the first ground terminal, a voltage of the second ground terminal, a voltage of the third ground terminal, and a voltage of the fourth ground terminal are the same.

5. The apparatus of claim 1, wherein the radio frequency amplifying circuit includes:
   an amplifying circuit electrically coupled to the third ground, the amplifying circuit configured to operate according to the bias voltage and output a differential signal; and
   an inductance circuit including a primary side, a secondary side, and a central tap, wherein the central tap receives one of the first supply voltage and the second supply voltage, and the primary side receives the differential signal so that the secondary side outputs a differential output.

6. The apparatus of claim 1, wherein the radio frequency amplifying circuit includes:
   an amplifying circuit electrically coupled to the third ground terminal, the amplifying circuit configured to operate according to the bias voltage and output a differential signal via a first output terminal and a second output terminal;
   an inductance circuit including a first inductor and a second inductor, wherein the first inductor is electrically coupled between the first output terminal and a node, the second inductor is electrically coupled between the second output terminal and the node, and the node is between the first inductor and the second inductor and configured to receive one of the first supply voltage and the second supply voltage; and
   a capacitance circuit including a first capacitor and a second capacitor, wherein the first capacitor is electrically coupled to the first output terminal, one end of the first inductor is electrically coupled between the first output terminal and the first capacitor, the second capacitor is electrically coupled to the second output terminal, and one end of the second inductor is electrically coupled between the second output terminal and the second capacitor, and the first capacitor and the second capacitor are configured to receive the differential signal and accordingly output a differential output.

7. The apparatus of claim 1, wherein the radio frequency amplifying circuit includes:
   an amplifying circuit electrically coupled to the third ground terminal, the amplifying circuit configured to operate according to the bias voltage and output a single-ended signal via an output node;
   an inductor electrically coupled between the power supply circuit and the output node; and
   a capacitor electrically coupled to the output node, the capacitor configured to output a single-ended output according to the single-ended signal.

8. The apparatus of claim 1, further comprising:
   a control circuit configured to generate a first control signal controlling the first switch and a second control signal controlling the second switch,
   wherein when a requirement for an output of the radio frequency amplifying circuit is lower than a threshold, the control circuit turns on the first switch with the first control signal, and when the requirement for the output of the radio frequency amplifying circuit is higher than the threshold, the control circuit turns on the second switch with the second control signal.

9. The apparatus of claim 1, wherein the apparatus is included in a Bluetooth device.

10. The apparatus of claim 1, wherein the apparatus is included in a device for internet of thighs (IOT).

\* \* \* \* \*